United States Patent
Benz et al.

(10) Patent No.: US 7,254,378 B2
(45) Date of Patent: Aug. 7, 2007

(54) RECEIVER SYSTEM FOR DECODING DATA EMBEDDED IN AN ELECTROMAGNETIC SIGNAL

(75) Inventors: Christoph Benz, Ohlsbach (DE); Andreas Körner, Waldbronn (DE); Stefan Gierl, Karlsruhe (DE)

(73) Assignee: Harman Becker Automotive Systems GmbH, Karlsbad (DE)

( * ) Notice: Subject to any disclaimer, the term of this patent is extended or adjusted under 35 U.S.C. 154(b) by 317 days.

(21) Appl. No.: 10/841,236

(22) Filed: May 7, 2004

(65) Prior Publication Data

US 2005/0037721 A1 Feb. 17, 2005

(30) Foreign Application Priority Data

May 8, 2003 (EP) .................. 03010418

(51) Int. Cl.
*H04B 1/06* (2006.01)
(52) U.S. Cl. ................ 455/277.1; 455/561; 455/277.2; 455/562.1
(58) Field of Classification Search ............... 455/45, 455/186.1, 67.11, 67.14, 135, 160.1, 161.3, 455/101, 561, 562.1, 277.1, 277.2; 701/209
See application file for complete search history.

(56) References Cited

U.S. PATENT DOCUMENTS

| | | | | |
|---|---|---|---|---|
| 3,988,678 A | * | 10/1976 | Hodge ................. | 455/67.16 |
| 5,160,002 A | * | 11/1992 | Suzuki ................. | 455/186.1 |
| 5,475,677 A | * | 12/1995 | Arnold et al. ........... | 455/552.1 |
| 5,553,313 A | | 9/1996 | Klos .................... | 455/51.1 |
| 5,574,993 A | * | 11/1996 | Kobayashi et al. ....... | 455/126 |
| 5,991,282 A | * | 11/1999 | Langlet et al. .......... | 370/347 |
| 6,141,536 A | * | 10/2000 | Cvetkovic et al. ........ | 455/45 |
| 6,253,152 B1 | * | 6/2001 | Ito ..................... | 701/209 |
| 6,295,462 B1 | * | 9/2001 | Kudoh ................. | 455/561 |
| 6,611,677 B1 | * | 8/2003 | Lindenmeier et al. ..... | 455/277.1 |

(Continued)

FOREIGN PATENT DOCUMENTS

DE 198 30 608 A1 1/2000

(Continued)

OTHER PUBLICATIONS

European Patent Office Search Report regarding Application No. EP 03 01 0418, dated Sep. 10, 2003, 2 pages.

*Primary Examiner*—Lana N. Le
(74) *Attorney, Agent, or Firm*—Brinks Hofer Gilson & Lione (57) ABSTRACT

A system for decoding data, such as travel and traffic information, configured in data blocks embedded in an electromagnetic signal, such as a broadcasted radio signal, has been developed. The system includes a method and receiver for decoding the data with a background tuner in a manner that does not impair the ability of the background tuner to demodulate other signals. While a main tuner is tuned to demodulate a first electromagnetic signal to produce a data stream, the background tuner is switched to decode the data blocks only when the data blocks are expected to be received. In the remaining time, the background tuner is free to demodulate other signals to support a diversity or other function. If a data block is not received, or not received when expected, the background tuner returns to demodulating one or more other frequencies after a predetermined time interval has elapsed.

33 Claims, 4 Drawing Sheets

U.S. PATENT DOCUMENTS 6,847,802 B2 * 1/2005 Migliaccio .................. 455/45
2005/0245206 A1 * 11/2005 Kaikkonen et al. ...... 455/562.1

FOREIGN PATENT DOCUMENTS

| EP | 0 977 386 A1 | | 2/2000 |
| EP | 1 303 065 A2 | | 4/2003 |
| JP | 08127290 A | * | 5/1996 |
| JP | 10019593 A | * | 1/1998 |

* cited by examiner

RECEIVER SYSTEM FOR DECODING DATA EMBEDDED IN AN ELECTROMAGNETIC SIGNAL

PRIORITY CLAIM

This application claims priority under 35 U.S.C. § to European Patent Application No. 03010418.6, filed May 8, 2003. The disclosure of the above application is incorporated herein by reference.

BACKGROUND OF THE INVENTION

1. Technical Field

This invention relates to a receiver including two tuners, which decodes digital data contained in electromagnetic signals, such as radio broadcast signals. Further, this invention relates to a method for decoding digital data in such signals.

2. Related Art

Worsening traffic congestion has generated a demand for accurate and timely information on traffic conditions. Broadcasters, such as radio broadcasters, cannot respond simply by increasing the number of on-air announcements that are broadcast using traditional delivery modes, because this would be unacceptable to listeners. Many listeners are concerned that such announcements are untrustworthy, repetitive and irritating unless the information is relevant to them. The transmission of traffic and travel information ("TTI") using data broadcast methods potentially solves this problem because the TTI data can be transmitted and decoded inaudibly, and filtered by a receiver to help ensure that listeners only obtain data that is relevant to their journey.

Multiple delivery methods of TTI services have emerged. Examples of TTI delivery methods include: digital audio broadcast ("DAB"), digital video broadcasting terrestrial ("DVBT"), the global system for mobile communications ("GSM"), the universal mobile telecommunication system ("UMTS"), and the radio data system ("RDS"). In addition, approaches to deliver this information via the Internet have been proposed. Because RDS has been widely deployed in Europe and elsewhere, car manufactures have integrated radio receivers for vehicles with multi-functional displays in vehicle dashboards. Often, these integrated systems further include modules such as telematic devices or a navigation system.

RDS uses a technique of adding data to a sub-carrier on an existing stereo transmission in such a way that the data may be decoded inaudibly. RDS is designed with a wide range of features that support program-related services, and allow non-program related data services to be added, if the capacity exists. One service supported by the RDS features is the alternative frequency ("AF") service. The AF service enables receivers to scan the radio frequency band to find the frequency at which a particular program may be received most clearly. In general, the AF service communicates the frequencies at which various transmitters broadcast the same program in the same or adjacent physical areas (the "alternative frequencies"). This enables receivers equipped with a memory to store a list of the alternative frequencies, thereby reducing the time needed to switch frequencies when scanning for a clearer transmission. Another service supported by the RDS features is the program service ("PS") name feature. The PS name feature enables an RDS receiver to display the name of the program, instead of, for example, the tuning frequency.

Other services that may be supported by the RDS features include the traffic announcement ("TA") and traffic program ("TP") services, which inform a receiver as to whether the signal being received carries traffic announcements. Further services supported by the RDS features include program type ("PTY"), radio text ("RT"), clock type and date ("CT"), decoder identification ("DI"), dynamic PTY indicator ("PTYI"), enhanced other networks information ("EON"), music speech switch ("MS"), open data applications ("ODA") and program item number ("PIN") services. Another service enabled by RDS is the traffic message channel ("TMC"). The objective of the RDS TMC is to broadcast digital traffic and TTI messages as data in an FM transmission of a program so that these messages may be decoded inaudibly by a receiver. The digital traffic and TTI messages may be communicated to a user via a visual interface or display. This allows delivery of accurate, timely and relevant information without the need to interrupt the program.

A receiver used to decode electromagnetic signals, such as radio broadcast signals that include a program and digital data, may include a main tuner and a background tuner. The main tuner is usually responsible for demodulating the program, such as a broadcasted radio broadcast program, and for providing the demodulated signal to an interface such as a speaker for conversion into sound waves. Further, the main tuner may be used to demodulate and decode digital data relating to the program being demodulated. For example, the data may be RDS data. In contrast, the primary task of the background tuner is to scan the frequency band and decode other electromagnetic signals at other frequencies that include the same program as that being demodulated by the main tuner ("alternative frequencies"). Commonly, the alternative frequencies are identified within the RDS data stream (often using the AF feature) included along with the program in the signal demodulated by the main tuner. Therefore, the RDS data stream may be decoded by the main tuner and communicated to the background tuner. The background tuner may then analyze the RDS data stream to obtain the alternative frequencies. In addition, the main tuner may be used to decode other types of RDS data configured in data blocks, such as RDS TMC data. It is also possible for the background tuner to decode such data blocks. In both solutions, the main tuner and the background tuner may be tuned to a fixed frequency.

SUMMARY

In order to provide accurate, timely and relevant information, it is important to receive the data blocks that are included in a signal, such as a radio broadcast signal, in their entirety. In addition, it may be desirable to receive data blocks from more than one signal. For example, if a radio signal is frequently changed by a listener (by changing the channel or the frequency of the radio signal), it may be desirable to constantly and simultaneously receive data blocks, such as those containing TTI, from a different radio signal. However, receivers that include a main tuner and a background tuner cannot use the background tuner to constantly decode the TTI (such a TM data) without impairing the ability of the background tuner to scan the frequency band for alternative frequencies at which signals containing the same data stream (such as a radio program) as contained in the signal received by the main tuner are modulated (the "diversity function" of the background tuner). Thus, a method for decoding digital data in a signal, such as a radio broadcast signal, is needed, as is a receiver including a background tuner that decodes data blocks and maintains its diversity function.

A method is provided for decoding digital data in a receiver that includes a main tuner and a background tuner. The method may be performed while the main tuner is tuned to a first receiving frequency to demodulate a first electromagnetic signal to produce a data stream (such as a radio program). In fact, the method may be performed as the main tuner is tuned among several receiving frequencies to demodulate several electromagnetic signals. In general, the method uses the background tuner to demodulate and decode the data blocks only when the data blocks are actually being received. This leaves the background tuner free to perform a diversity or other function, including radio data service ("RDS") functions, during the time intervals between successive data blocks. More specifically, the method may include initializing the background tuner to estimate a time interval after which the next data block is expected to begin, tuning the background tuner to perform a diversity function before the estimated time interval elapses, tuning the background tuner to demodulate and decode another data block and, if the data block cannot be decoded, tuning the background tuner to resume its diversity function after a predetermined time interval has elapsed.

A receiver is disclosed having a main tuner, a background tuner, and a timer. The main tuner may receive and demodulate a first electromagnetic signal to produce a data stream, such as a radio program. The background tuner is adapted to also receive and demodulate an electromagnetic signal. Additionally, the background tuner is also configured to decode the demodulated electromagnetic signal to retrieve any embedded digital data. Alternately, the background tuner may scan the frequency spectrum and demodulate one or more electromagnetic signals at different frequencies to produce one or more data streams. The background tuner may further include a switching module that determines when the background module is to switch between demodulating and decoding an electromagnetic signal and demodulating one or more other electromagnetic signals.

The receiver may be included in a receiver system for use in a variety of environments, including vehicles. The receiver system may include an input device, a receiver, and an interface. The input device may include an antenna or other device that can detect and communicate electromagnetic signals. The input device may detect and communicate to the receiver the electromagnetic signals. The interface, which may include a speaker, display and/or input, may receive a data stream and/or data blocks from the receiver and may convert this information into audio or visual form for communication to a user.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following drawings and description. The components in the figures are not necessarily to scale, emphasis instead being placed upon illustrating the principles of the invention.

DETAILED DESCRIPTION OF THE PREFERRED EMBODIMENTS

Figure 1:
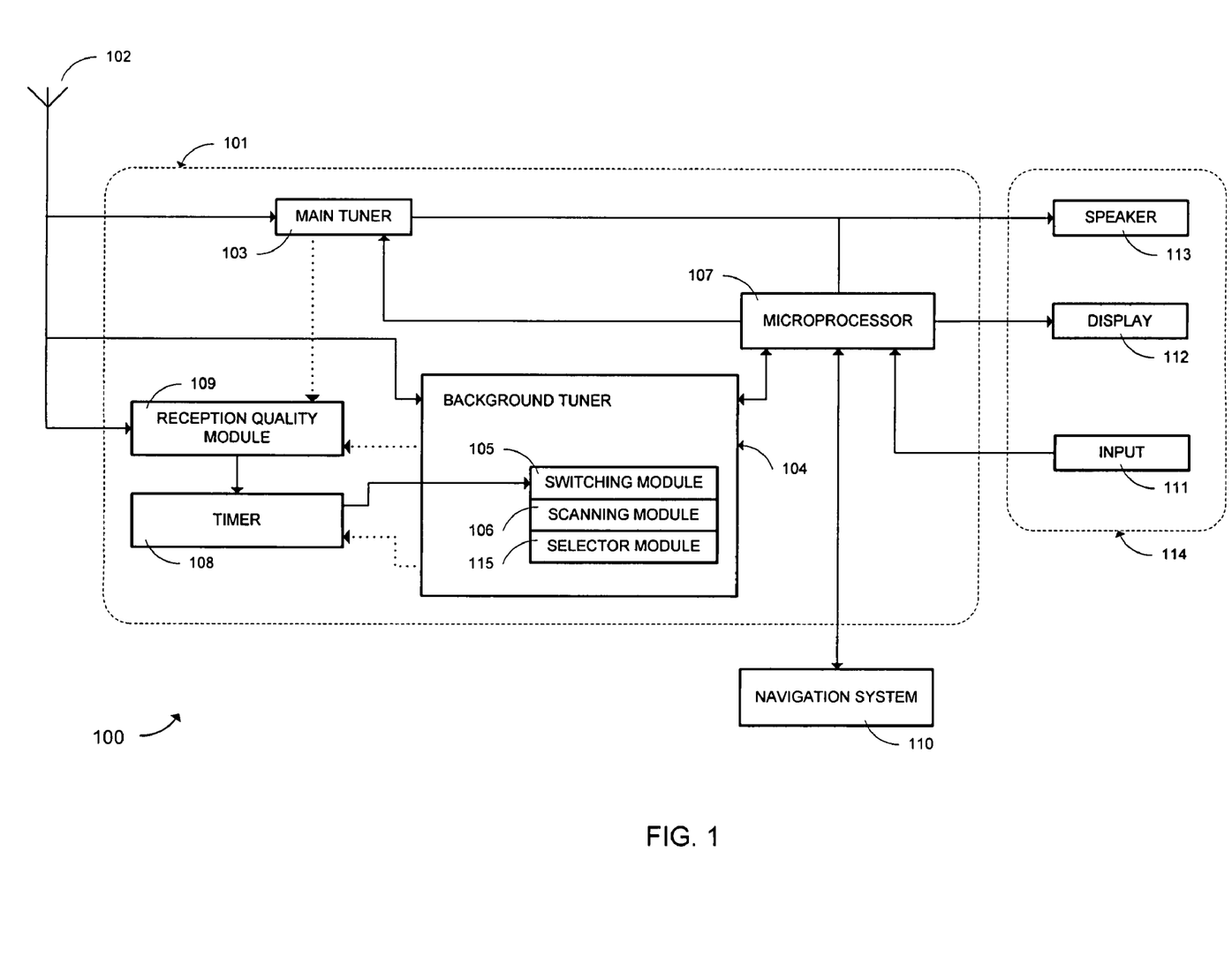
FIG. 1 is a block diagram of a receiver system.

An example of a receiver system for decoding data embedded in electromagnetic signals, such as radio broadcast signals, is shown in FIG. 1. The receiver system 100 may be used in a variety of environments, including vehicles, and generally includes an input device 102, a receiver 101, and an interface 114. The input device 102 may include an antenna or other device that can detect and communicate electromagnetic signals. These electromagnetic signals may include broadcasted signals, such as radio broadcast signals. A radio broadcast signal generally includes a data stream communicating a program that is transmitted, generally through the air, to a receiver. To create the radio broadcast signal, the data stream is modulated on a carrier wave of a given frequency. Many radio broadcast signals may be simultaneously transmitted because each signal may be modulated at a different frequency or channel.

The input device 102 generally detects, and communicates to the receiver 101 the electromagnetic signals. The receiver 101 demodulates and decodes (if needed) the information contained within the electromagnetic signals, which includes programming and/or digital data. The receiver 101 may also communicate the information to the interface 114, which converts the information into audio or visual form for communication to a user. The receiver 101 generally includes a main tuner 103, a background tuner 104, and a timer 108. It may further include a microprocessor 107, and a reception quality module 109. The main tuner 103 may be designed to receive an electromagnetic signal from the input device 102 and demodulate the electromagnetic signal to produce a data stream, such as a radio program.

The background tuner 104 may also receive an electromagnetic signal from the input device 102 and demodulate the electromagnetic signal. Additionally, the background tuner 104 may decode the demodulated electromagnetic signal to retrieve any embedded digital data. The electromagnetic signal received by the background tuner 104 may be the same as that received by the main tuner 103, or a different electromagnetic signal. In other words, the electromagnetic signal received by the background tuner may be received at the same or a different frequency that that received by the main tuner 103. Alternately, the background tuner 104 may scan the frequency spectrum and demodulate one or more electromagnetic signals at different frequencies to produce one or more data streams. It is possible that one or more of the electromagnetic signals demodulated by the background tuner contains the same data stream as the electromagnetic signal demodulated by the main tuner 103.

The background tuner may include a switching module 105, a scanning module 106, and may further include a selector module 115.

The timer 108 may be in communication with the switching module 105 and determine when the background tuner 104 is to demodulate and decode an electromagnetic signal to retrieve embedded data (a "decoding function"), and when the background tuner 104 is to scan the frequency spectrum to demodulate one or more electromagnetic signals (a "diversity function"). The timer 108 may determine when the background tuner 104 is to switch functions as a function of the quality of the electromagnetic signals. When the background tuner 104 is to switch between these functions, the timer 108 may produce a trigger signal. The timer may communicate the trigger signal to the switching module 105 causing the switching module 105 to tune the background tuner 104 to perform the appropriate function.

The reception quality module 109 may also receive electromagnetic signals from the input device 102. The reception quality module 109 may measure the reception quality of the data stream to which the main tuner 103 and/or the background tuner 104 is tuned, which may be used to support the diversity function. This allows the receiver 101 to be responsive to fluctuations in the quality of the received electromagnetic signals due to, for example, fading and interference. For example, the reception quality module 109 may determine the relative qualities of the electromagnetic signal received by the main tuner 103 and those scanned by the background tuner 104, as the background tuner 104 is performing its diversity function. The reception quality module 109 may communicate the relative qualities to the selector module 115, which may select which of the electromagnetic signals containing the desired data stream provides the highest relative quality.

The microprocessor 107 may enable communication between the receiver 101 and the interface 114. The microprocessor 107 may also enable communication between the receiver 114 and the navigation system 110. For example, travel and traffic information ("TTI") decoded by the background tuner 104 may be communicated to the navigation system 110. Alternately, the navigation system 110 may communicate a request for the background tuner 104 to tune to a different electromagnetic signal that includes TTI data.

The navigation system 110 is in communication with the receiver 101 and may receive the digital information (such as TTI data) decoded from the second electromagnetic signal by the background tuner 104. The navigation system 110 may use the digital information to select a travel route using a process often referred to as dynamic navigation. Additionally, or alternatively, the background tuner 104 may be adapted to select the second electromagnetic signal based on travel route information provided by the navigation system 110 or for the navigation system 110, itself, to select the second electromagnetic signal.

The interface 114 may include an input module 111, a display 112, and a speaker 113 separately, or in any combination. The input module 111 may enable a user to perform certain activities, including: selecting a program, programming the navigation system 110, and adjusting settings of the receiver 101. The display 112 may display information assembled from decoded data, such as RDS data or TTI information communicated from the background tuner 104 directly, or through the microprocessor 107. The speaker 113 may be in communication with the main tuner 101 and may convert a data stream, such as a program, into sound waves. Further, the speaker 113 may also convert information communicated from the background tuner 104 directly, or through the microprocessor 107 into sound waves.

For example, the receiver system described above may include a radio broadcast receiver for receiving digital information contained in radio broadcast signals. Such a radio broadcast receiver may also be used in other types of receivers, such as an in-vehicle receiver. In order to allow the radio broadcast receiver to perform both a decoding and a diversity function, the radio broadcast receiver may include a main tuner for receiving a first radio broadcast signal at a first receiving frequency, a background tuner for receiving a second broadcast signal at a second receiving frequency, and a third broadcast signal at a third receiving frequency, and a timer for estimating the time of transmission of the second data block in the second radio broadcast signal. The second radio broadcast signal may include digital data, which may be transmitted as discrete data blocks. The background tuner may include a switching module for switching the background tuner to the second frequency for receiving the data block, for switching the background tuner to at least one third frequency after the data block has been received, and for switching the background tuner back to the second receiving frequency to receive the second data block when the time estimated by the timer has expired. The switching module may be configured to switch the background tuner to the at least one third receiving frequency when a predetermined time interval has elapsed without the background tuner receiving a data block.

Moreover, it is possible for the radio broadcast signals received at the first and the at least third frequency to provide the same radio broadcast program. In order to display the digital information contained in the second and/or third radio broadcast channel signal, the radio broadcast receiver may also include a display. To output the digital information contained in the second and/or third radio broadcast channel signal, the radio broadcast receiver may also include a speaker.

The radio broadcast receiver may additionally implement the RDS service of scanning for alternative frequencies for receiving a radio broadcast program (the diversity function). To implement this service, the background tuner may include a frequency selector for scanning the frequency band to identify the frequency that provides the best reception quality for a given radio broadcast program. The background tuner scans the frequency band in the time interval between the end of the reception of a data block contained in the second radio broadcast signal and the estimated time for transmission of a subsequent data block.

The radio broadcast receiver may further include a reception quality module for measuring the reception quality of the second and/or third broadcast signal. This enables the radio broadcast receiver to be responsive to fluctuations in the reception quality of the radio broadcast signals, due to, for example, fading and interference. The measurements of the reception quality may be used, for example, by the timer to estimate the time interval for transmission of a subsequent data block and the predetermined time interval.

The digital information contained in the second radio broadcast signal may further be supplied to a navigation system, which is connected to the radio broadcast receiver. In a variation, the background tuner may be adapted to select the second receiving frequency based on travel route information provided by the navigation system.

Figure 2:
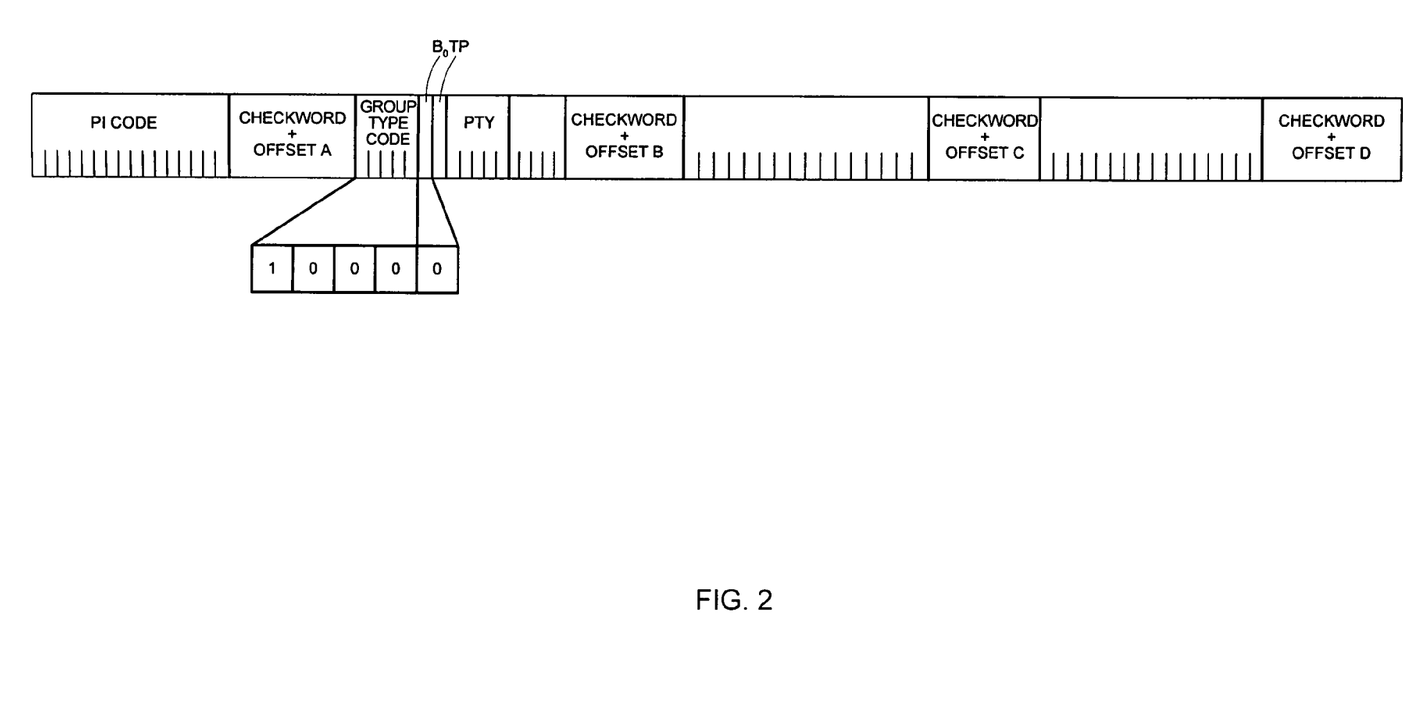
FIG. 2 is a diagram of a type 8A data group used for transmitting radio data system ("RDS") traffic message channel ("TMC") information.

Modern broadcasting systems often transmit digital information in combination with a program. For example, the radio data system ("RDS") data stream may include embedded traffic message channel ("TMC") data. Generally, the TMC data is configured in data blocks. The receiver 101 may be configured to decode TMC data transmitted along with a data stream in an RDS system. TMC data is generally in the format of a type 8A group, an example of which is shown in FIG. 2. In addition to the type 8A format, there are many different formats for data blocks. These different types of data blocks exist to enable the different RDS features, and may be concatenated to build the RDS data stream. Therefore, the RDS TMC data blocks are not transmitted continuously but are separated by a time interval of about 900 ms to about 1400 ms, which corresponds to roughly 8 to 12 RDS data blocks. More detailed information about packet types and the RDS standard is given in the respective documents defining the RDS standard and the employed protocols, which are available at the Comite Europeen de Normalisation (CEN)/European Committee for Standardization and are incorporated by reference into this document. The format and application of the message bits illustrated in FIG. 2 may be defined by the CEN standard EN 12312-1.

Although described in reference to the RDS standard for radio receivers and TTI transmitted in the TMC data format, the systems, methods and receivers described in this document are also applicable to other systems. These other systems include those that broadcast digital information along with programming, such as: digital audio broadcast ("DAB"), digital video broadcast terrestrial ("DVBT"), global system for mobile communications ("GSM"), and universal mobile telecommunication system ("UMTS") services. In addition, the systems, methods and receivers described in this document may also be implemented in a radio broadcast data system ("RBDS") environment, due to the close relationship between the RDS standard and the RBDS standard. Further, the systems, methods and receivers described in this document are also applicable to dynamic and static RDS.

When the receiver of FIG. 1 is configured to decode TMC data, it is important that the receiver 101 demodulates and decodes all TMC data blocks completely. This is of concern when the TMC data is demodulated and decoded by the background tuner 104, particularly if the background tuner 104 is also to perform a diversity function (scans the frequency spectrum for alternate frequencies in order to determine the best receiving frequency). For example, if the background tuner 104 is continuously demodulating and decoding an electromagnetic signal to continuously produce the TMC data stream, the background tuner 104 is no longer able to perform its diversity function. Conversely, if the background tuner is performing its diversity function by continually scanning the frequency spectrum and demodulating one or more electromagnetic signals, the background tuner 104 may only decode TMC data sporadically.

Figure 3:
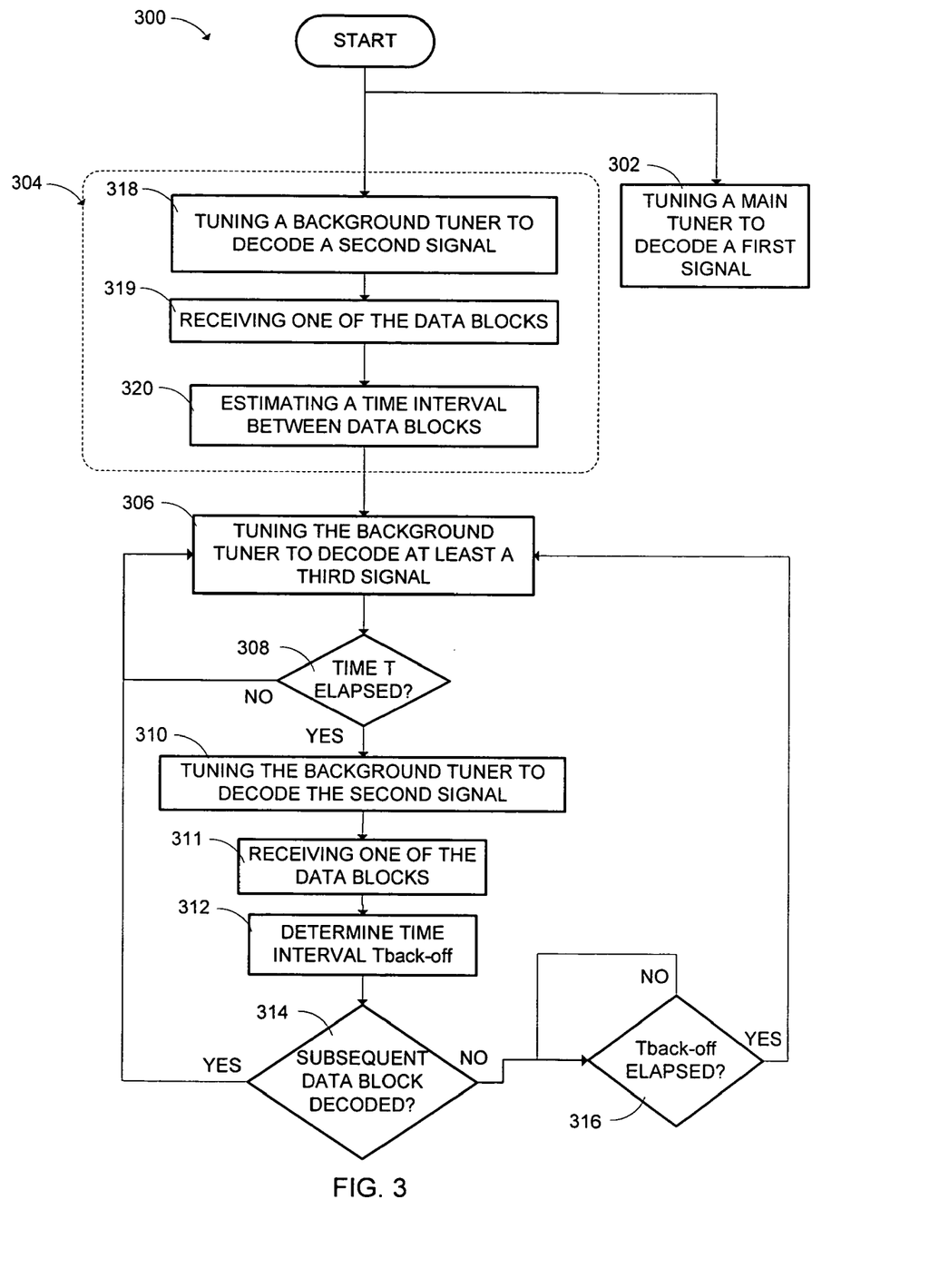
FIG. 3 is a flow chart of a method for decoding data embedded in an electromagnetic signal.

This conflict may be resolved by using the background tuner 104 to demodulate and decode the TMC data only when the TMC data blocks are actually being received. This leaves the background tuner 104 free to perform its diversity function during the time intervals between successive TMC data blocks. An example of a method by which a receiver, such as the receiver shown in FIG. 1, may decode TMC data blocks while continuing to perform its diversity function is shown in FIG. 3. This method 300 includes: initializing the background tuner to estimate a time interval 304, tuning the background tuner to perform a diversity function before the estimated time interval elapses 306, 308, tuning the background tuner to demodulate and decode another data block 310, 314, and 311, and if the data block cannot be decoded, tuning the background tuner to resume its diversity function after a predetermined time interval has elapsed 314, 312, 316 and 306. The method of FIG. 3 may be performed while a main tuner (such as that shown in FIG. 1) is tuned and demodulates a first electromagnetic signal (received at a first frequency or channel) to produce a data stream. In fact, the method of FIG. 3 may be performed as the main tuner is tuned among several electromagnetic signals (at several frequencies or channels).

Initializing the background tuner to estimate a time interval 304 generally includes tuning the background tuner to a second frequency or channel to demodulate a second electromagnetic signal 318, decoding at least one of the data blocks 319 in the second electromagnetic signal, and estimating a time interval between data blocks 320. The background tuner is generally tuned to the second frequency to demodulate the electromagnetic signal that includes the TMC data blocks. This second electromagnetic signal may be the same as that demodulated by the main tuner, or a different signal. Once the second electromagnetic signal is demodulated, it is decoded to produce at least one of the TMC data blocks 319. The TMC data block or blocks are used by a timer (such as that shown in FIG. 1) to estimate a time interval T 320 that indicates when the next TMC data block is expected to start. The timer may, for example, estimate time interval T by measuring the mean time interval between successive TMC data blocks in the RDS data stream. Because the actual time interval between the starts of the TMC data blocks is generally not constant, it is further possible to determine a deviation of the actual time interval from the estimated time interval T, depending on the duration of the initialization phase. The deviation may be stored in a receiver (such as that shown in FIG. 1).

After initializing the background tuner, the background tuner is tuned to demodulate at least a third electromagnetic signal 306 (received at third frequency or channel, or many third frequencies or channels) so that the background tuner may perform its diversity or some other RDS function. When the diversity function is performed, demodulating at least a third electromagnetic signal 306 generally includes scanning the background tuner over frequencies that may include electromagnetic signals with the same data stream as the first electromagnetic signal (the alternative frequencies) and demodulating the electromagnetic signals at these frequencies. It is possible that during scanning, the background tuner may demodulate the same electromagnetic signal as the main tuner, thereby demodulating the same data stream (such as a program) as the main tuner. If the alternative frequencies are identified as RDS information in the first electromagnetic signal, they may be decoded by the main tuner and communicated to the background tuner, or, alternately, they may be decoded by the background tuner. The background tuner may be tuned to demodulate at least a third electromagnetic signal 306 (as identified by the alternate frequencies) until the estimated time interval T elapses 308.

The third electromagnetic signal (or a plurality of third electromagnetic signals, as the case may be) may be used to determine the quality of the electromagnetic signals available at the alternative frequencies in comparison with the first electromagnetic signal received at the first frequency (the diversity function). The background tuner may be tuned to at least the third frequency to receive at least the third electromagnetic signal in the time interval between the end of the reception of a data block contained in the second electromagnetic signal and the expiration of the estimated time interval for a subsequent data block to be received.

In order to read digital information in the form of, for example, RDS information from the third electromagnetic signal, the method may further include demodulating and decoding any digital information contained in the third electromagnetic signal. This step (not shown) may be included in the method 300 before or simultaneously with any step subsequent to tuning the background tuner to demodulate at least a third signal 306. In general, the background tuner may decode the digital information in the third electromagnetic signal (and others, if applicable) to determine the alternative frequencies. Moreover, the digital information contained in the second and/or third electromagnetic signal may be produced in an audio and/or visible format.

For the usage of traffic and travel information (TTI), it may be desirable to supply the digital information in the second radio broadcast channel signal to a navigation system to enable the navigation system to select the travel route based on the received TTI information (dynamic navigation).

Once the estimated time interval T has elapsed, the background tuner is tuned to the second frequency or channel to demodulate the second electromagnetic signal and decode a subsequent TMC data block 310. If the beginning of the subsequent data block is received, indicating that the entire data block can be decoded 314, the subsequent data block is decoded 311. After the subsequent TMC data block is decoded 311, the background tuner is switched back to its diversity or other function 306 and the method may repeat. If however, in step 314 the beginning of the subsequent data block is not received, the entire data block cannot be decoded. Therefore, a predetermined time interval Tback-off may be determined 312. The duration of this predetermined time interval Tback-off may be determined by maintaining a statistic of the actual time interval between two successive TMC data blocks. This statistic may be updated when the background tuner is switched from performing a diversity or other TMC function to performing a decoding function. Once Tback-off has elapsed 316, a timer (such as the timer shown in FIG. 1) may produce a trigger signal. The trigger signal may be communicated to a switching module (such as that shown in FIG. 1) that causes the background tuner to switch to performing its diversity function 306.

The time interval T between two TMC data blocks may be influenced by the reception quality of the second electromagnetic signal. Therefore, the periodic switching of the background tuner between the third and perhaps other electromagnetic signals and the second electromagnetic signal can be adapted accordingly. When of reception quality is poor, it is usually difficult to successfully receive RDS data and, decode TMC data blocks. In these cases, the predetermined time interval Tback-off is shortened accordingly. Alternatively, when interferences during reception occur over a longer time period, a new initialization may be performed.

Figure 4:
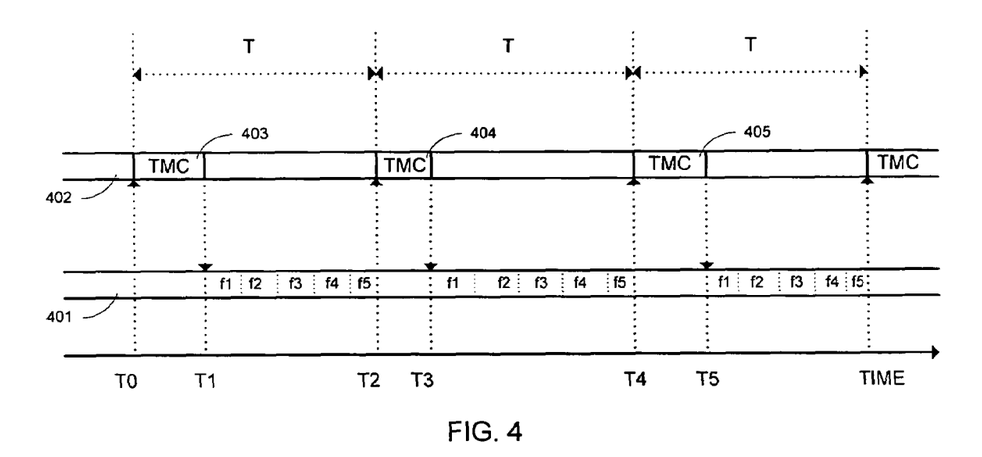
FIG. 4 is a diagram showing the switching between an electromagnetic signal carrying RMS TMC data and a different electromagnetic signal containing an RDS data stream signals.
Figure 5:
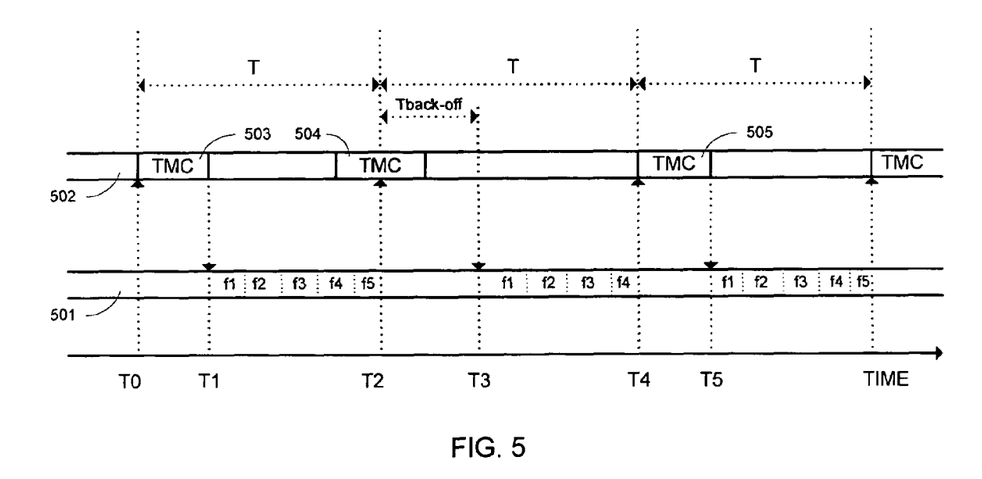
FIG. 5 is a diagram showing the switching between an electromagnetic signal carrying RMS-TMC data and a different electromagnetic signal containing an RDS data stream signals when a data block in the electromagnetic signal carrying RMS-TMC data has been missed.

To further illustrate the method of FIG. 3, examples of the electromagnetic signals, among which the background tuner is tuned, and how the background is tuned among them are shown in FIGS. 4 and 5. The example shown in FIG. 4 illustrates how the background tuner is tuned among the electromagnetic signals when the TMC data blocks in the second electromagnetic signal occur at the estimated time interval T. FIG. 4 shows a first electromagnetic signal 401 (which may include a radio broadcast signal), a second electromagnetic signal 402 (which may also include a radio broadcast signal, such as that shown in FIG. 3) that provides, for example TTI, and includes several TMC data blocks 403, 404, and 405. In the example shown in FIG. 4, the background tuner is tuned to a second electromagnetic signal 402 to decode TTI, such as TMC data, and among a collection of scanned signals 401, each at different frequencies, to perform its diversity function. The scanned signals 401 include a third electromagnetic signal f1, a fourth electromagnetic signal f2, a fifth electromagnetic signal f3, a sixth electromagnetic signal f4, and a seventh electromagnetic signal f4. The background tuner may be tuned for initialization by a timer and a switching module (such as those shown in FIG. 1). The timer may produce a trigger signal, which is communicated to the switching module. In response, the switching module switches the background tuner to the second electromagnetic signal 402 so that the background tuner can perform its diversity function.

During initialization of the background tuner (step 304 in FIG. 3), the background tuner is tuned to a second receiving frequency or channel to demodulate the second electromagnetic signal 402 and to decode at least the first TMC data block 403. Additionally, the first TMC data block 403 (or additional data blocks if such data blocks are decoded during initialization) is used to estimate the time interval T. This estimation may be performed by a timer (such as that shown in FIG. 1). Upon completion of the initialization of the background tuner, the background tuner is tuned to perform its diversity function. For example, as shown in FIG. 4, assuming completion of the initialization at time T1, the background tuner is tuned at time T1 to demodulate the scanned signals 401, during the time interval between the end of TMC data block T0 and the beginning of TMC data block T2. After expiration of the estimated time interval T at time T2, the background tuner is tuned back to the second electromagnetic signal 402 to decode and receive TMC data block 404. Estimated time interval T may be measured by a timer (such as that shown in FIG. 1), which, when T expires, produces a trigger signal. The trigger signal may be communicated to a switching module (such as that shown in FIG. 1), which causes the background tuner to switch functions.

In contrast, the example shown in FIG. 5 illustrates how the background tuner is tuned among the electromagnetic signals when not all the TMC data blocks in the second electromagnetic signal occur at the estimated time interval T. In the example shown in FIG. 5, the background tuner is tuned to a second electromagnetic signal 502 to decode the TMC data blocks 503, 504, and 505 and among a collection of scanned signals 501 to demodulate a third electromagnetic signal at f1, a fourth electromagnetic signal at f2, a fifth electromagnetic signal at f3, a sixth electromagnetic signal at f4, and a seventh electromagnetic signal at f5. Upon completion of the initialization of the background tuner, the background tuner is tuned to perform its diversity function.

Assuming completion of the initialization at time T1, the background tuner is tuned to demodulate the scanned signals 501, during the time interval between the end of TMC data block T0 and the beginning of TMC data block T2. After expiration of the estimated time interval T, the background tuner is tuned back to the second electromagnetic signal to decode and receive TMC data block 504. As in the previous example, estimated time interval T may be measured by a timer, which communicates a trigger signal to a switching module that causes the background tuner to switch functions. However, in this example, the TMC data block 504 was transmitted prior to the expiration of the estimated time interval T. As a result, the beginning of the TMC data block 504 is missed and the background tuner is unable to demodulate the entire data block 504. The same result would occur if the TMC data block 504 was never transmitted or received. Therefore, in these cases, to prevent the background tuner from remaining tuned to the second electromagnetic signal 502 until the end of the next TMC data block 505 at time T5, the TMC data block 504 is not decoded. Instead, the background decoder is tuned to the scanned signals 501 after a predetermined time period Tback-off has elapsed. When Tback-off elapses, the background tuner switches back to performing its diversity or other RDS function, regardless of whether an RDS data block has been received. The predetermined time Tback-off is measured from the time the background tuner attempts to and is unsuccessful in demodulating the TMC data block 504, which in this example is time T2. Tback-off may be determined by a timer (such as that shown in FIG. 1), which, at the end of Tback-off, produces a second trigger signal. The second trigger signal may be communicated to a switching module that causes the background tuner to switch functions.

While various embodiments of the invention have been described, it will be apparent to those of ordinary skill in the art that many more embodiments and implementations are possible within the scope of the invention. Accordingly, the invention is not to be restricted except in light of the attached claims and their equivalents.

What is claimed is:

1. A receiver for decoding data configured in a plurality of data blocks, comprising:
    a first tuner operative to demodulate a first electromagnetic signal; and
    a second tuner operative to demodulate a second electromagnetic signal and decoding the plurality of data blocks, where the second tuner is initialized to estimate the time interval between RDS data blocks and operative to switch from the non-diversity function to the diversity function based on the time interval between successive data blocks.

2. A receiver for decoding data configured in a plurality of data blocks, comprising:
    a first tuner operative to demodulate a first electromagnetic signal;
    a second tuner operative to demodulate a second electromagnetic signal that comprises the plurality of data blocks, and decode the plurality of data blocks; where the second tuner is operative to switch from the non-diversity function to the diversity function based on the time interval between successive data blocks; and
    a timer in communication with the second tuner and operative to estimate a time interval between data blocks, where the second tuner is initialized with the time interval estimate and operative to switch from the non-diversity function to the diversity function between successive data blocks.

3. The receiver of claim 2, where the first electromagnetic signal is a broadcasted signal.

4. The receiver of claim 3, where the broadcasted signal is a radio broadcast signal.

5. The receiver of claim 2, where the second electromagnetic signal is a broadcasted signal.

6. The receiver of claim 5, where the broadcasted signal is a radio broadcast signal.

7. The receiver of claim 5, where the second electromagnetic signal comprises a radio data service data stream.

8. The receiver of claim 7, where the plurality of data blocks comprise travel message channel data embedded in the radio data service data stream.

9. The receiver of claim 2, where the second electromagnetic signal equals the first electromagnetic signal.

10. The receiver of claim 2, where the first electromagnetic signal comprises a program.

11. The receiver of claim 10, where the second tuner comprises a scanning module that identifies any of the at least one other electromagnetic signal that comprise the program.

12. The receiver of claim 11, where the second tuner comprises a selector module that selects a signal from among the first electromagnetic signal and the at least one other electromagnetic signals.

13. The receiver of claim 2, where the timer further determines a deviation of the estimated time interval between data blocks.

14. The receiver of claim 2, where the timer produces a first trigger signal at an end of the estimated time interval between data blocks.

15. The receiver of claim 14, where the second tuner comprises a switching module in communication with the timer, where the switching module is configured to tune the second tuner to the second electromagnetic signal in response to the first trigger signal is received.

16. The receiver of claim 15, where the switching module is configured to tune the second tuner to one of the at least one other electromagnetic signals after one of the plurality of data blocks is received.

17. The receiver of claim 15, where the switching module is configured to tune the second tuner to the first electromagnetic signal after one of the plurality of data blocks is received.

18. The receiver of claim 15, where the timer is configured to determine a second time interval after the first trigger signal is produced.

19. The receiver of claim 18, where the timer produces a second trigger signal if one of the plurality of data blocks is not received during the second time interval.

20. The receiver of claim 19, where the switching module tunes the second tuner to one of the at least one other electromagnetic signals when the second trigger signal is received.

21. The receiver of claim 19, where the switching module tunes the second tuner to the at least first electromagnetic signals when the second trigger signal is received.

22. A receiver for decoding data configured in a plurality of data blocks in a first electromagnetic signal, comprising:
    a first means for demodulating a second electromagnetic signal;
    a second means for demodulating the first electromagnetic signal and decoding the plurality of data blocks; where the second tuner is initialized to estimate the time interval between RDS data blocks and operative to switch from the non-diversity function to the diversity function based on the time interval between successive data blocks; and
    a third means for estimating a time interval between data blocks in communication with the second means, where the second means comprises a means for demodulating at least one other electromagnetic signal during the estimated time interval between data blocks.

23. A receiver system for decoding data configured in a plurality of data blocks, the receiver system comprising:
    an input device in communication with a first electromagnetic signal and a second electromagnetic signal that comprises the plurality of data blocks;
    a receiver in communication with the input device, the receiver comprising:
        a first tuner demodulating the first electromagnetic signal;

a second tuner demodulating the second electromagnetic signal, and decoding the plurality of data blocks; where the second tuner is initialized to estimate the time interval between RDS data blocks and operative to switch from the non-diversity function to the diversity function based on the time interval between successive data blocks.

a timer in communication with the second tuner and estimating a time interval between data blocks, where the second tuner demodulates at least one other electromagnetic signal during the estimated time interval between data blocks; and an interface in communication with the receiver and communicating the second electromagnetic signal and the data to a user.

24. The receiver system of claim 23, where the input device comprises an antenna that receives at least one of the electromagnetic signals.

25. The receiver system of claim 23, where the interface comprises a speaker that converts the second electromagnetic signal into an audio signal.

26. The receiver system of claim 23, where the interface comprises a display that converts the second electromagnetic signal into a visual signal.

27. The receiver system of claim 26, where the interface comprises an input that enables selection of the first electromagnetic signal.

28. The receiver system of claim 23, further comprising a navigation system in communication with the receiver and receiving the data.

29. A method for decoding data in a receiver that comprises a first tuner and a second tuner, the method comprising:

tuning a first tuner to demodulate a first electromagnetic signal;

tuning a second tuner to demodulate a second electromagnetic signal that comprises the data configured in a plurality of data blocks; where the second tuner is initialized to estimate the time interval between RDS data blocks and operative to switch from the non-diversity function to the diversity function based on the time interval between successive data blocks;

decoding at least one of the plurality of data blocks;

estimating a time interval between data blocks;

tuning the second tuner to demodulate at least one third electromagnetic signal during the estimated time interval between data blocks; and tuning the second tuner to the second electromagnetic signal at an end of the time interval between data blocks.

30. The method of claim 29, where one of the at least one third electromagnetic signals equals the first electromagnetic signal.

31. The method of claim 29, further comprising determining a second time interval if one of the plurality of data blocks is not decoded.

32. The method of claim 31, further comprising tuning the second tuner to at least the third frequency at an end of the second time interval.

33. A method for decoding data configured in a plurality of data blocks, the method comprising:

demodulating a first electromagnetic signal; and simultaneously with demodulating the first electromagnetic signal, performing the following steps:

demodulating a second electromagnetic signal that comprises the plurality of data blocks;

decoding the plurality of data blocks;

estimating a time interval between data blocks;

demodulating at least a third electromagnetic signal during the estimated time interval between data blocks; and switching between demodulating the second electromagnetic signal and demodulating the third electromagnetic signal based on the time interval between the between successive data blocks.

* * * * *